(12) United States Patent
Takeuchi et al.

(10) Patent No.: US 7,180,051 B2
(45) Date of Patent: Feb. 20, 2007

(54) POLARIZATION STATE DETECTING SYSTEM, LIGHT SOURCE, AND EXPOSURE APPARATUS

(75) Inventors: Seiji Takeuchi, Utsunomiya (JP); Yasuhiro Kishikawa, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 38 days.

(21) Appl. No.: 11/256,931

(22) Filed: Oct. 25, 2005

(65) Prior Publication Data

US 2006/0033019 A1   Feb. 16, 2006

Related U.S. Application Data

(62) Division of application No. 10/429,742, filed on May 6, 2003, now Pat. No. 7,015,456.

(30) Foreign Application Priority Data

May 10, 2002   (JP) .............................. 2002-134958

(51) Int. Cl.
*G02F 1/01* (2006.01)
*G02B 5/30* (2006.01)
(52) U.S. Cl. ..................... 250/225; 359/495
(58) Field of Classification Search ................ 250/225; 359/485, 495, 497, 629, 634, 636
See application file for complete search history.

(56) References Cited

U.S. PATENT DOCUMENTS 3,463,575 A   8/1969   Gates, Jr. .................... 350/172

(Continued)

FOREIGN PATENT DOCUMENTS

DE   34 35 189 A1   4/1986

(Continued)

OTHER PUBLICATIONS

French Search Report dated Sep. 30, 2003, issued in corresponding French patent application No. 0305630, forwarded in a Communication dated Oct. 8, 2003.

(Continued)

*Primary Examiner*—Thanh X. Luu
(74) *Attorney, Agent, or Firm*—Fitzpatrick, Cella, Harper & Scinto (57) ABSTRACT

A polarization state detecting system includes a first dividing device for dividing incident light into two light beams having the same polarization state as that of the incident light, a detector for detecting one of the two light beams from the first dividing device, through a polarizer, and an acquisition device for acquiring information regarding the polarization state of the incident light on the basis of an output of the detector. The first dividing device includes a first element, a second element and a third element. The second element is disposed so that a p-polarization component reflected by the first element is reflected by the second element as an s-polarization component. The third element is disposed so that a p-polarization component transmitted through the first element is reflected by the third element as an s-polarization component, and one of the two light beams is light reflected by the first element and reflected by the second element, while the other of the two light beams is light transmitted through the first element and transmitted through the third element.

5 Claims, 7 Drawing Sheets

U.S. PATENT DOCUMENTS

| | | | |
|---|---|---|---|
| 4,252,410 A | 2/1981 | Jain | 350/370 |
| 4,671,660 A | 6/1987 | Distl et al. | 356/367 |
| 4,822,169 A | 4/1989 | Distl et al. | 356/364 |
| 5,073,025 A * | 12/1991 | Brooks | 356/367 |
| 5,585,918 A | 12/1996 | Takeuchi et al. | 356/237 |
| 5,652,657 A | 7/1997 | Yoshii et al. | 356/394 |
| 5,719,702 A | 2/1998 | Decker | 359/487 |
| 5,767,962 A | 6/1998 | Suzuki et al. | 356/237 |
| 5,777,744 A | 7/1998 | Yoshii et al. | 356/372 |
| 5,784,202 A | 7/1998 | Noguchi | 359/618 |
| 5,861,952 A | 1/1999 | Tsuji et al. | 356/349 |
| 5,933,219 A | 8/1999 | Unno | 355/71 |
| 2002/0024704 A1 | 2/2002 | Erdogan et al. | 359/156 |
| 2002/0024804 A1 | 2/2002 | Bothe et al. | 362/31 |
| 2004/0012844 A1 | 1/2004 | Ohtsuki et al. | 359/341.1 |

FOREIGN PATENT DOCUMENTS

| | | |
|---|---|---|
| EP | 1 139 521 A1 | 10/2001 |
| JP | 6-18332 | 1/1994 |
| JP | 9-199394 | 7/1997 |
| JP | 2000-131193 | 5/2000 |
| JP | 2001-85307 | 3/2001 |
| JP | 2001-337299 | 12/2001 |
| WO | WO 02/12947 A1 | 2/2002 |

OTHER PUBLICATIONS

Japanese Office Action dated Nov. 9, 2004, issued in corresponding Japanese patent application No. 2002-134958, with English translation.

* cited by examiner

POLARIZATION STATE DETECTING SYSTEM, LIGHT SOURCE, AND EXPOSURE APPARATUS

This application is a divisional application of patent application Ser. No. 10/429,742, filed May 6, 2003 now U.S. Pat. No. 7,015,456.

FIELD OF THE INVENTION AND RELATED ART

This invention relates generally to a polarization state detecting system, a light source, and an exposure apparatus. More particularly, the invention is effective as a polarization state detecting system for detecting Stokes parameters of light flux, an exposure apparatus having such a polarization state detecting system, and a light source having such a polarization state detecting system.

Figure 6:
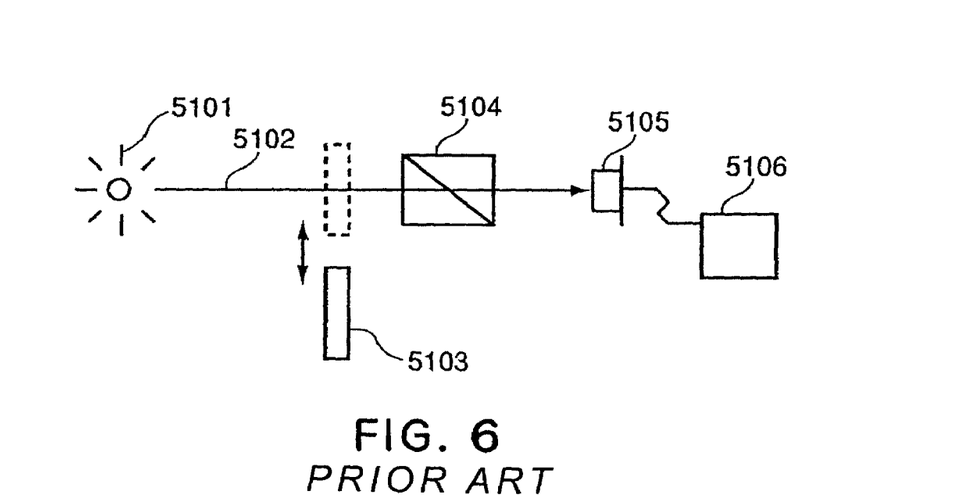
FIG. 6 is a schematic view of a conventional Stokes meter.

FIG. 6 shows a known structure of a Stokes meter. The Stokes meter is a device for detecting four Stokes parameters $S_0$, $S_1$, $S_2$ and $S_3$ of light flux, to thereby detect the polarization state of the light flux. These Stokes parameters $S_0$, $S_1$, $S_2$ and $S_3$ are indices that indicate total light quantity, a p-linear polarization component or an x-polarization component with respect to a normal coordinates axis, a +45° linear polarization component, and a clockwise circular polarization component, respectively.

In FIG. 6, denoted at 5101 is a light source, and denoted at 5102 is a light flux from the light source. Denoted at 5103 is a phase difference plate, and denoted at 5104 is a polarizer. Denoted at 5105 is a photodetector, and denoted at 5106 is a display unit or an operation unit. The polarizer at 5104 is made rotatable, and the phase plate at 5103 is arranged to be retractably inserted into the light path of the light flux being incident.

As the polarizer is rotated while the phase difference plate is held retracted, the outputs of the photodetector corresponding to polarizer rotational angles 0°, 90°, and 45°, respectively, are denoted by $I_1$, $I_2$ and $I_3$, respectively. Also, the output of the photodetector where the wavelength of the light source is $\lambda$ and the phase difference plate, adapted to produce a phase difference of $\lambda/4$ in the polarized light, is inserted into the light path with its phase advancing axis held at 45° while the polarizer angle is set at 90°, is denoted at $I_4$.

On the basis of these photodetector outputs, the Stokes parameters $S_0$, $S_1$, $S_2$ and $S_3$ can be determined by calculation, as follows:

$$S_0 = I_1 + I_2$$

$$S_1 = I_1 - I_2$$

$$S_2 = 2 \times I_3 - (I_1 + I_2)$$

$$S_3 = 2 \times I_4 - (I_1 + I_2).$$

Thus, the parameters are used to examine the polarization state of light flux from a light source.

Conventional Stokes meters in many cases use a rotational system, such as a polarizer. Therefore, when the Stokes parameters change largely, the measurement becomes difficult to accomplish or, alternatively, a large-size measurement device becomes necessary. Furthermore, when the light flux whose polarization state is measured by use of a Stokes meter is then used, there is a time delay between when the light flux is measured by the Stokes meter and when the light flux is actually used in an apparatus, or the like. This means that the parameters of the light flux as the same is actually used are not detectable. Additionally, when the polarization state of exposure light in an exposure apparatus is measured by use of a conventional Stokes meter, each measurement has to be carried out while rotating a polarizer or the like. This requires a long measurement time, and it leads to a decrease in throughput of the exposure apparatus.

SUMMARY OF THE INVENTION

It is accordingly an object of the present invention to provide a polarization state detecting system, an exposure apparatus, a light source, and a device manufacturing method, by which at least one of the above-described problems can be solved.

In accordance with an aspect of the present invention, there is provided a polarization state detecting system, comprising first dividing means for dividing incident light into two light beams having the same polarization state as the incident light, a detector for detecting one of the two light beams from the first dividing means, through a polarizer, and acquisition means for acquiring information regarding the polarization state of the incident light on the basis of an output of the detector.

In accordance with another aspect of the present invention, there is provided an exposure apparatus for exposing a substrate with a pattern of a reticle, comprising first dividing means for dividing light from a light source into two light beams having the same polarization state as the light from the light source, a detector for detecting one of the two light beams from the first dividing means, through a polarizer, and acquisition means for acquiring information regarding the polarization state of the light from the light source, on the basis of an output of said detector, wherein the reticle is illuminated with the other of the two light beams.

In accordance with a further aspect of the present invention, there is provided a light source device, comprising a light source, first dividing means for dividing light from the light source into two light beams having the same polarization state as the light from the light source, a first detector for detecting one of the two light beams, through a polarizer, and acquisition means for acquiring information regarding the polarization state of the light from the light source, on the basis of an output of the first detector.

In accordance with a still further aspect of the present invention, there is provided a device manufacturing method, comprising the steps of dividing light from a light source into two light beams having the same polarization state as the light from the light source, detecting one of the two light beams through a polarizer and by use of a detector, acquiring information regarding the polarization state of the light from the light source, on the basis of an output of said detector, exposing a substrate with a pattern of a reticle, by illuminating the reticle with the other light beam of the two light beams, and developing the exposed substrate.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the attached drawings.

[Embodiment 1]

A first embodiment of the present invention will be described with reference to FIGS. 1 and 2.

Figure 1:
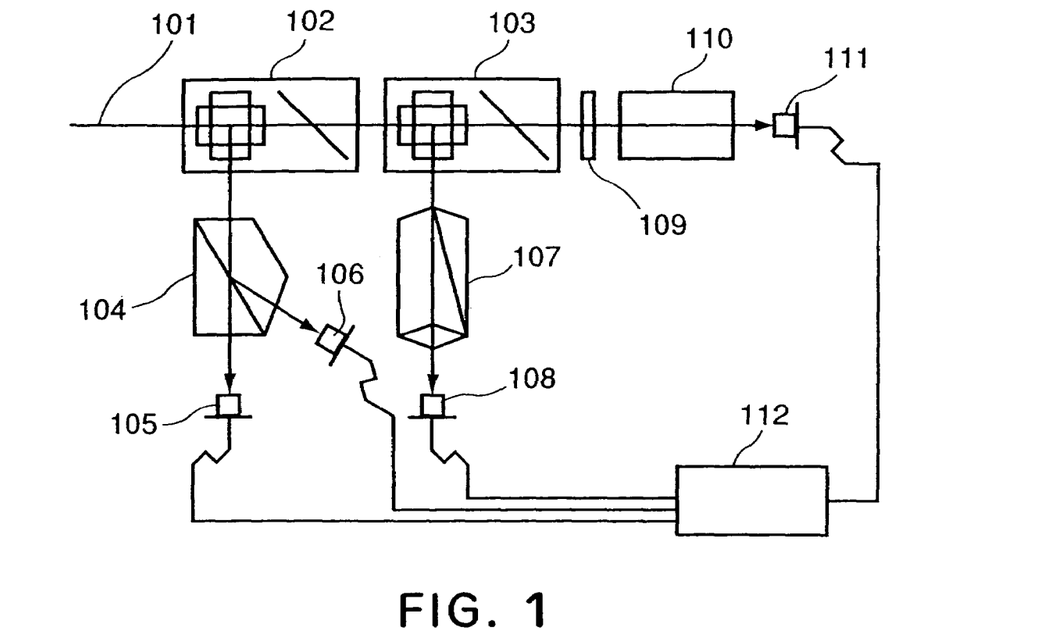
FIG. 1 is a schematic and diagrammatic view of a polarization state detecting system according to a first embodiment of the present invention.

Denoted in FIG. 1 at 101 is incident light, and denoted at 102 and 103 are light beam dividing means (dividing means) each for dividing incident light into two light beams having the same polarization state as the incident light. Denoted at 104 is a dual-beam type Glan-Thompson polarization prism, and denoted at 107 and 110 are single-beam type Glan-Thompson polarization prisms. Denoted at 109 is a λ/4 phase difference plate, and denoted at 105, 106, 108 and 111 are photodetectors (detector means). Denoted at 112 is an operation circuit (acquisition means).

The incident light 101 enters the light beam dividing means 102, by which it is divided into a first light beam being reflected with the same polarization state as that of the incident light, and a second light beam being transmitted with the same polarization state as that of the incident light. The first light beam enters the dual-beam type Glan-Thompson prism 104, by which it is divided into two polarized light beams being orthogonal to each other. These light beams are incident on the photodetectors 105 and 106, respectively.

The second light beam passed through the light dividing means 102 further enters the light beam dividing means 103, by which it is divided into a third light beam being reflected with the same polarization state as that of the incident light, and a fourth light beam being transmitted with the same polarization state as that of the incident light.

The third light beam enters the single-beam type Glan-Thompson prism 107 having its transmission axis rotated by −45° and fixed thereat, such that a +45° linearly polarized light component is received by the photodetector 108. The fourth light beam impinges on the λ/4 phase difference plate having its phase advancing axis rotated by +45° and fixed thereat, and subsequently, it enters the single-beam type Glan-Thompson prism 110 having its transmission axis fixed at 0°, such that only a polarized light component being transmitted is received by the photodetector 111.

On the basis of the light quantities detected by the photodetectors 105, 106, 108 and 111, the operation circuit 112 calculates and detects the Stokes parameters.

Now, referring to FIG. 2, details of the light beam dividing means for conserving the polarization state will be explained.

Figure 2:
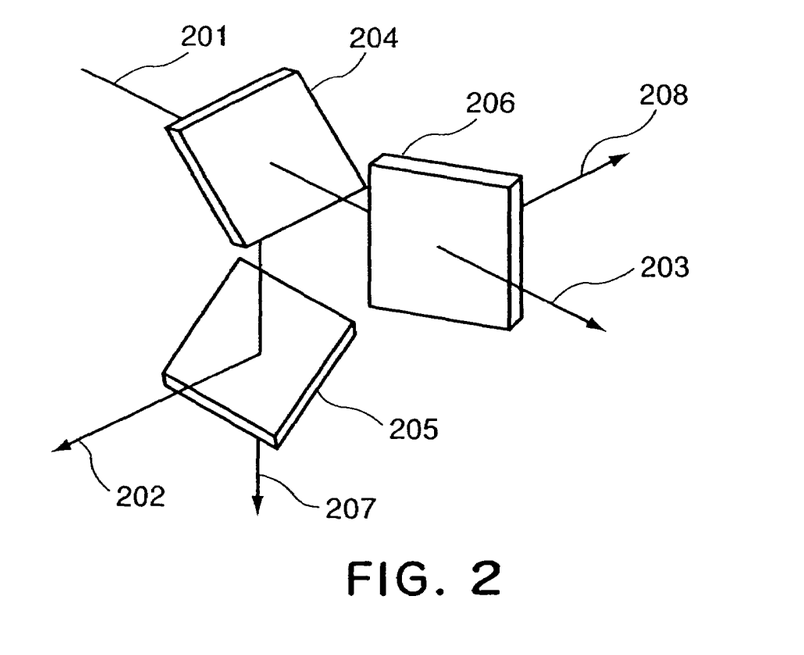
FIG. 2 is a schematic view for explaining details of light dividing means in the first embodiment of the present invention.

FIG. 2 illustrates light beam dividing means for dividing incident light into two light beams having the same polarization state as that of the incident light. Denoted at 201 is incident light, and denoted at 204, 205, and 206 are plane parallel-plates each being disposed so that light is incident thereon with an incidence angle of 45°. Denoted at 202 is a first light beam being reflected twice by two plane parallel-plates, and denoted at 203 is a light beam passed through both of two plane parallel-plates. Denoted at 207 and 208 are unwanted light, not to be used in this embodiment.

The first plane parallel-plate 204 and the second plane parallel-plate 205 are disposed so that a p-polarized light component reflected by the first plane parallel-plate 204 is reflected, as an s-polarized light component, by the second plane parallel-plate 205. With this structure, the polarized light component being reflected by the first plane parallel-plate 204 as s-polarized light, is reflected by the second plane parallel-plate 205 as a p-polarized light component.

On the other hand, the third plane parallel-plate 206 is provided so that a p-polarized light component passed through the first plane parallel-plate 204 is transmitted through the third plane parallel-plate 206 as an s-polarized light component. With this structure, the polarized light component, passed through the first plane parallel-plate 204 as s-polarized light, is reflected by the third plane parallel-plate 206 as a p-polarized light component.

Now, the principle that incident light is divided into two light beams of the same polarization state as that of the incident light will be explained. Here, for simplicity, reflection at the bottom face of the plane parallel-plate is disregarded.

If the incident light is perfect polarized light, the electric field vector thereof can be calculated as:

$$E = E_p + E_s,$$

that is, by dissolving it into a linearly polarized component $E_p$, going to become a p-polarized component when reflected by the first plane parallel-plane, and a linearly polarized light component $E_s$, going to become an s-polarized light component. When the incident light is partially polarized light or non-polarized light, since they can be regarded as an aggregation of a plurality of perfect polarized light components, it would be enough to conserve the perfect polarization state of each of them.

When three plane parallel-plates made of the same material are used, since the three plane parallel-plates all have the same complex amplitude reflectances $r_p$ and $r_s$ with respect to p-polarization and s-polarization, if the complex amplitude of the linearly polarized light component (p-polarized light component when reflected by the first plane parallel-plate) of the incident light is $E_p$ while the complex amplitude of the s-polarized light component is $E_s$, then the complex amplitude $E_{11}$ of the first polarized light component of the first light beam 202, obtainable by twice reflections, is expressed by:

$$E_{11} = r_s r_p E_p.$$

On the other hand, the complex amplitude of the second polarization component $E_{12}$ is:

$$E_{12} = r_p r_s E_s.$$

Therefore, the complex amplitude $E_1$ of the reflection light corresponding to the sum of them is:

$$E_1 = r_s r_p (E_p + E_s).$$

Since this is a light beam corresponding to the incident light, as merely being multiplied by a constant $r_s r_p$, it is seen that the first light beam 202 is just a light beam having the same polarization state as that of the incident light.

On the other hand, the complex amplitude $E_{21}$ of the first polarized light component of the second light beam 203, obtainable through twice transmissions is:

$$E_{21} = t_s t_p E_p.$$

On the other hand, the complex amplitude $E_{22}$ of the second polarized light component is:

$$E_{22} = t_p t_s E_s.$$

The complex amplitude $E_1$ of the reflection light, corresponding to the sum of them, is:

$$E_2 = t_s t_p (E_p + E_s).$$

Since this is a light beam just corresponding to the incident light, as merely being multiplied by a constant $t_s t_p$, it is seen that the second light beam 203 is just a light beam having the same polarization state as that of the incident light.

It should be noted here that, although, in this example, the light is incident upon a plane parallel-plate at an incidence angle of 45°, if the three plates have the same incidence angle, it is unnecessary to use the angle of 45°. Further, three optical elements such as gratings or beam splitters having the same light dividing property, such as reflection characteristic or transmission characteristic, with respect to polarization, may be used with substantially the same advantageous effects. Also, $r_p$, $r_s$, $t_p$ and $t_s$ may not be real-number constants. They may be complex-number constants where a splitter having a film, for example, is used.

Although unwanted light is not illustrated in FIG. 1, since the unwanted lights 207 and 208 in FIG. 2 are stray lights, a beam damper may be used to absorb them.

In FIG. 1, the operation circuit (acquisition means) 112 calculates the light quantities from the four photodetectors in the manner to be described below, and detects the Stokes parameters. Here, the two light beam dividing means 102 and 103 have the same property, and also it is assumed that the incident light and emitted light have a relationship as described above. Further, the transmissivity of the Glan-Thompson prism and the waveplate is assumed as 100%. Then, the complex amplitudes $E_A$, $E_B$, $E_C$ and $E_D$ of electric fields of the light beams which are obtainable at the photodetectors 105, 106, 108 and 111, respectively, are:

$$E_A = r_p r_s E_s$$

$$E_B = r_s r_p E_p$$

$$E_C = (1/\sqrt{2}) r_s r_p t_s t_p (E_p + E_s)$$

$$E_D = (1/\sqrt{2}) t_s^2 t_p^2 e^{(\pi/2)i} [e^{-(\pi/4)i} E_s + e^{(\pi/4)i} E_p].$$

Thus, the light quantities $I_1$, $I_2$, $I_3$ and $I_4$ detected by the photodetectors 105, 106, 108 and 111 are:

$$I_1 = |r_p r_s|^2 |E_s|^2$$

$$I_2 = |r_s r_p|^2 |E_p|^2$$

$$I_3 = (1/2) |r_s r_p t_s t_p|^2 |E_s + E_p|^2$$

$$I_4 = (1/2) |t_s t_p|^4 |e^{-(\pi/4)i} E_s + e^{(\pi/4)i} E_p|^2.$$

The constants $r_p$, $r_s$, $t_p$ and $t_s$ may be determined beforehand by calculation or measurement, and a correction operation may be done in relation to these constants. By doing so, the Stokes parameters $S_0$, $S_1$, $S_2$ and $S_3$ can be determined.

$$S_0 = (I_1 + I_2)/|r_p r_s|^2$$

$$S_1 = (I_1 - I_2)/|r_p r_s|^2$$

$$S_2 = 2 \times I_3/|r_p r_s t_p t_s|^2 - S_0$$

$$S_3 = 2 \times I_4/|t_p t_s|^4 - S_0.$$

When the Stokes parameters are determined in the manner described above, all the information about the polarization state, including the quantity of light, can be obtained. However, if desired, only necessary data may be measured and calculated.

Although a Glan-Thompson prism is used as the prism 104 in this example, a Rochon prism, a Senarmont prism, a Wollaston prism, or a polarization beam splitter made of a dielectric multilayered film, or the like, may be used. In summary, an optical element effective to produce orthogonal polarization components can be used. It should be noted in this connection that the operation formulae described above may differ, in dependence upon which polarization component is detected by each detector.

Further, although the prisms 107 and 110 have been described as Glan-Thompson prisms, any optical element may be used in place of it if a linearly polarized light component can be extracted thereby. An inexpensive apparatus can be constructed when a Brewster's window is used as a polarizer.

Further, in place of dividing the light into two light beams at 104, a polarizer and a detector may be arranged so that: a polarizer effective to extract linearly polarized light is used and, in front of the light dividing means 102, another light dividing means of the same type is provided to separate another light beam, such that a linearly polarized light component orthogonal to the light beam extracted by the dividing means 102 is extracted. This arrangement is particularly effective when two precision prisms are used to obtain linearly polarized components accurately.

[Embodiment 2]

A second embodiment of the present invention concerns an apparatus having a light source, wherein the polarization state of light is measured in real time by use of a polarization state detecting system. This embodiment will be described with reference to FIG. 3. Denoted at 301 is a light source, and denoted at 302 is light dividing means for dividing light from the light source into two light beams, while conserving the polarization state. Denoted at 303 is an apparatus in which the light from the light source is to be used. Denoted at 304 is a polarization state detecting system such as described with reference to the first embodiment. Denoted at 305 and 306 are two light beams having the same polarization state as that of the light from the light source.

Figure 3:
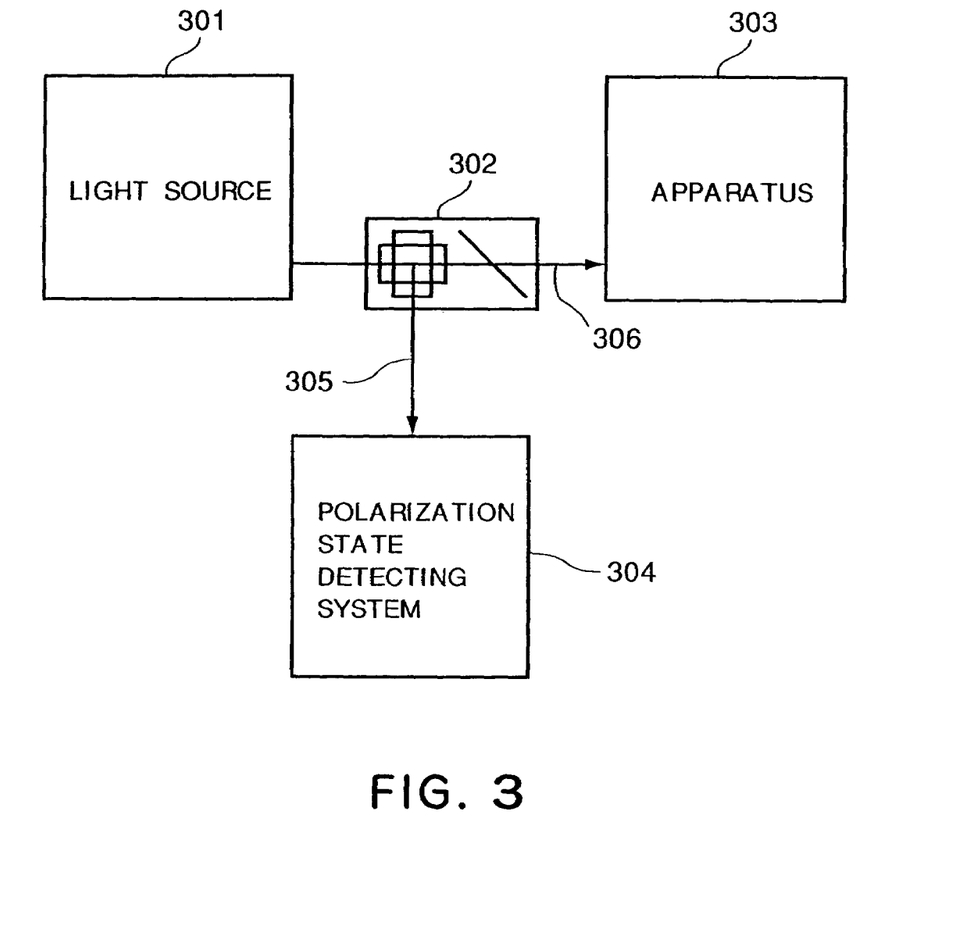
FIG. 3 is a schematic and diagrammatic view of a system with a light source unit, according to a second embodiment of the present invention.

The light from the light source 301 enters the light beam dividing means 302, such as shown in FIG. 2 of the first embodiment, for dividing the light into two light beams while conserving the polarization state thereof, such that light beams 305 and 306 having the same polarization state are produced. One (305) of the light beams is going to be used for measurement of the polarization state, with the polarization state detecting system 304. The other light beam 306 is directly introduced into the apparatus.

In accordance with this embodiment, the polarization state of the light is measured in real time. The apparatus of this embodiment may be any apparatus such as an illumination system of various types, an exposure apparatus, an optical measuring system, an optical observation system, an interferometer system, and so on, wherein a change in polarization state is influential to the performance.

[Embodiment 3]

A third embodiment of the present invention concerns an apparatus similar to the second embodiment, wherein the information regarding the polarization state obtained through the polarization state detecting system is transmitted to the apparatus, to thereby control the apparatus on the basis of that information.

As regards the apparatus controlling method, there may be a method in which the apparatus is stopped if a desired polarization state is not provided, or a method in which any optical system of the apparatus is adjusted so that the polarization state of the light introduced into the apparatus is converted into a polarization state which is best suited for use in the apparatus. Alternatively, the measurement result of the apparatus may be corrected in accordance with the polarization state detected.

[Embodiment 4]

A fourth embodiment of the present invention concerns a light source unit in which the polarization state of light is measured in real time by use of a polarization state detecting system and feedback control is made on the basis of it. This embodiment will be described with reference to FIG. 4. Denoted at 401 is a light source, and denoted at 402 is light beam dividing means for dividing the light from the light source into two light beams, while conserving the polarization state. Denoted at 404 is a polarization state detecting system such as described with reference to the first embodiment. Denoted at 405 and 406 are two light beams having the same polarization state as that of the light from the light source. Denoted at 407 is a light source controller.

Figure 4:
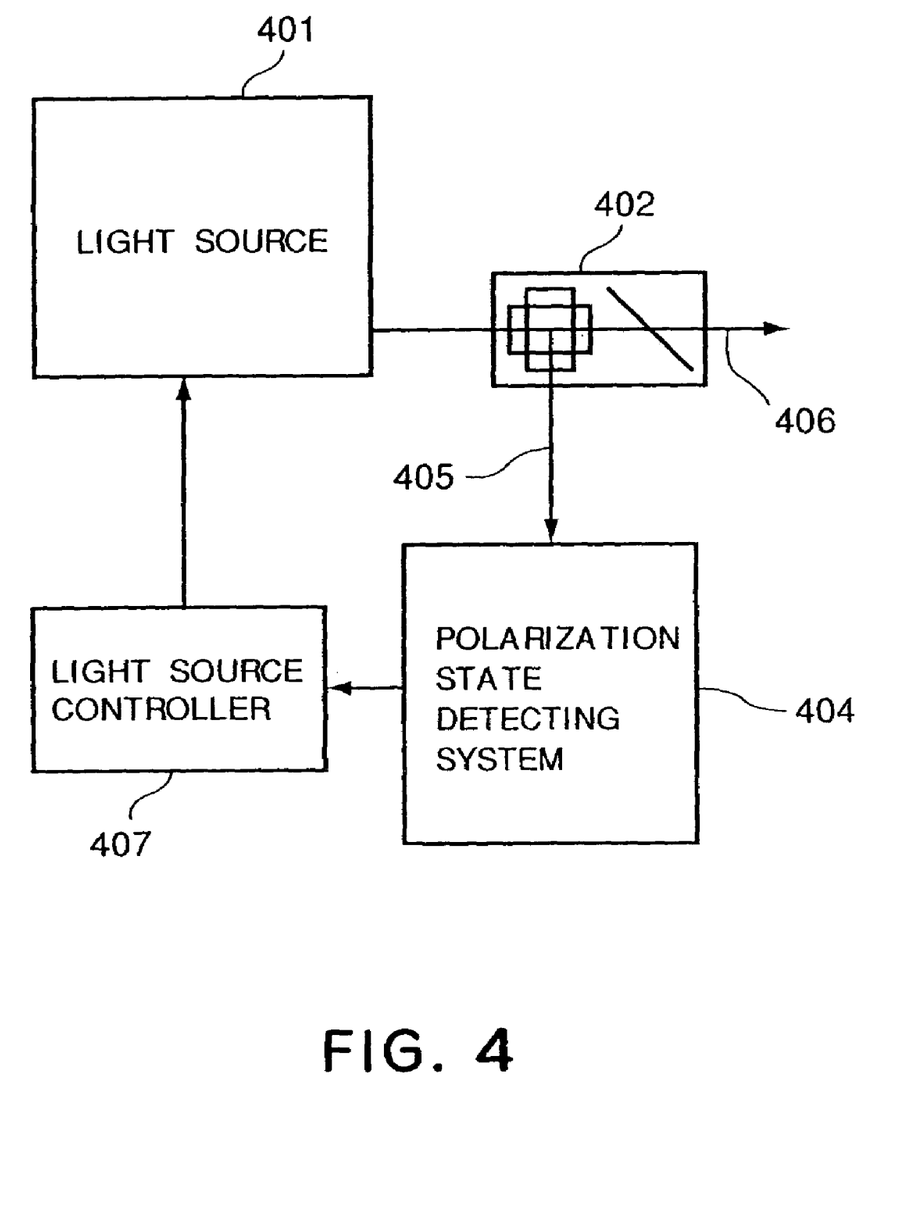
FIG. 4 is a schematic and diagrammatic view of a light source unit according to a fourth embodiment of the present invention.

The light from the light source 401 enters the light dividing means 402 for dividing the light into two light beams while conserving the polarization state thereof, such that two light beams 405 and 406 having the same polarization state are produced. One (405) of the light beams is going to be used for measurement of the polarization state of the light from the light source, through the polarization state detecting system 404.

In accordance with this embodiment, the polarization state of the light from the light source is measured in real time. The information regarding the polarization state is transmitted to the light source controller 407, and it is fed back to the light source such that a light emission parameter of the light source or a polarization state controlling element (not shown) included in the light source is controlled to maintain the polarization state constant. Alternatively, in some cases, the control may be made not only to maintain a constant polarization state, but also to cause a desired change therein.

[Embodiment 5]

A fifth embodiment of the present invention concerns a light source unit in which the light source of the fourth embodiment comprises a pulse light source. The remaining portion of this embodiment has essentially the same structure.

[Embodiment 6]

A sixth embodiment of the present invention concerns an exposure apparatus having a light source, wherein the polarization state of light is measured in real time by use of a polarization state detecting system. This embodiment will be explained with reference to FIG. 5, wherein denoted at 501 is a light source, and denoted at 502 is light beam dividing means for dividing the light from the light source into two light beams while conserving the polarization state of the same. Denoted at 503 is an exposure apparatus in which light from the light source is to be used, and denoted at 504 is a polarization state detecting system such as described with reference to the first embodiment. Denoted at 505 and 506 are two light beams having the same polarization state as that of the light from the light source.

Figure 5:
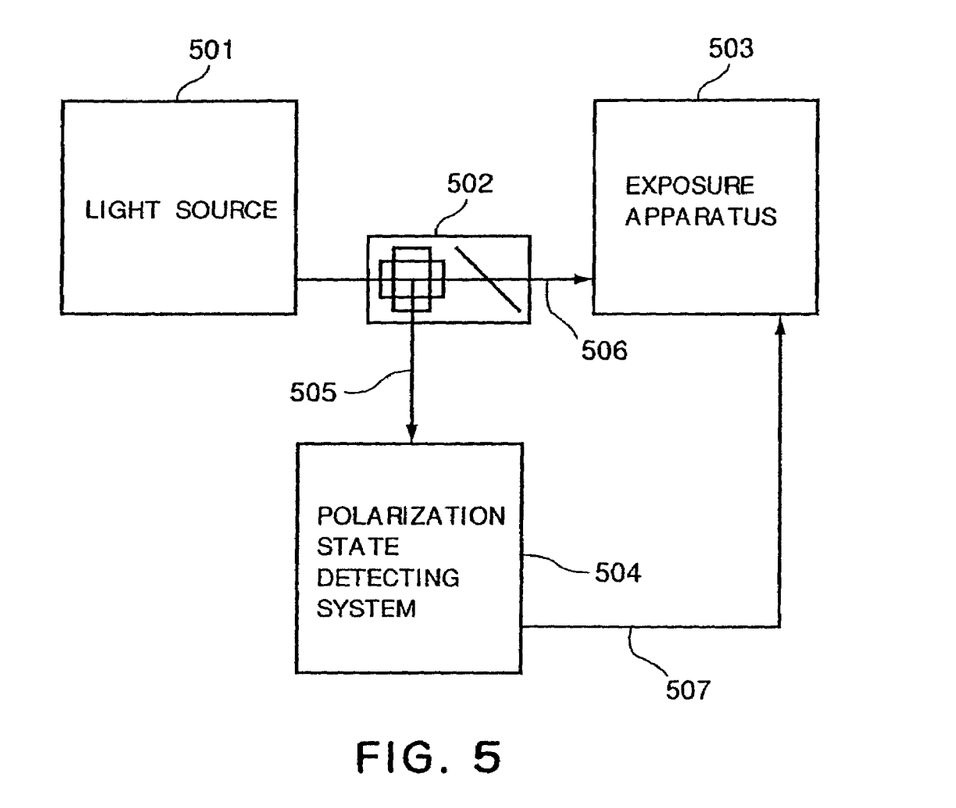
FIG. 5 is a schematic and diagrammatic view of an exposure apparatus according to a sixth embodiment of the present invention.

The light from the light source 501 enters the light beam dividing means 502, such as shown in FIG. 2 of the first embodiment, for dividing the light into two light beams while conserving the polarization state thereof, such that light beams 505 and 506 having the same polarization state are produced. One (505) of the light beams is going to be used for measurement of the polarization state, with the polarization state detecting system 504. The other light beam 506 is directly introduced into the exposure apparatus.

Figure 7:
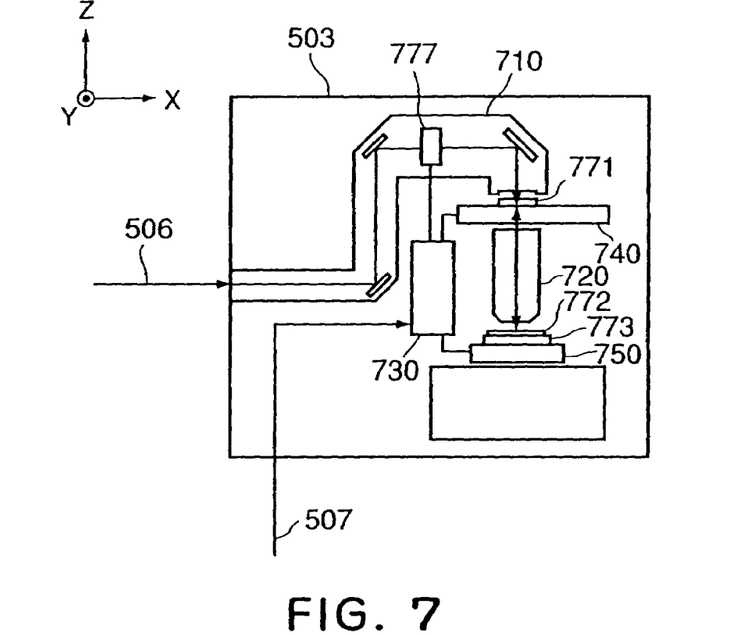
FIG. 7 is a schematic view for explaining details of an exposure apparatus according to the sixth embodiment of the present invention.

FIG. 7 illustrates a general structure of the exposure apparatus of the FIG. 5 embodiment. This exposure apparatus is arranged so that a pattern of a reticle or mask 771 (as an original) is transferred by exposure onto a wafer 772 (as a substrate), and it is suitable for the manufacture of devices such as semiconductor devices (ICs or LSIs), image pickup devices (CCDs), or magnetic heads, for example.

Denoted in FIG. 7 at 506 is light from the light dividing means. Here, the light 506 is shaped by an illumination optical system 710, and then it illuminates a pattern of the reticle 771. Denoted at 777 is polarization control means having a polarizer, for example. It is disposed at a position substantially optically conjugate with a pupil of a projection optical system 720. The polarization control means 777 serves to control the polarization state in a predetermined region of an effective light source which is formed at the pupil of the projection optical system. By controlling the polarization state of the effective light source by use of this polarization control means, exposure of a more precise and fine pattern is enabled.

The reticle 771 is held by a reticle stage 740, which is movable in a reticle scan direction along an X-Y plane in FIG. 7. Denoted at 720 is a projection optical system having a predetermined reduction magnification ratio. The pattern of the reticle 771 being illuminated through the illumination optical system 710 is projected onto the wafer 772 by the projection optical system 720, whereby the wafer 772 is exposed with that pattern. The wafer 772 has been coated with a resist material (photosensitive material), so that a latent image is formed there by the exposure. The wafer 772 is mounted on a wafer stage 750, through a wafer chuck 773.

The wafer stage 750 is arranged to move the wafer 772 thereon along the stage plane (X-axis and Y-axis directions), upwardly and downwardly (X-axis direction) and also in tilt and rotational directions about these axes, and to perform positioning control of the wafer. Through the positioning control of the wafer stage 750 in the Z-axis direction, the focus of the projection optical system 720 can be adjusted with respect to the wafer 772.

As regards the motion and positioning control of the reticle stage 740 and wafer stage 750, the position and attitude of each stage is measured by using sensors (not shown) and the thus obtained positional information is used to perform the same.

The information regarding the polarization state obtained through the polarization state detecting system 504 is transmitted to the exposure apparatus, as depicted by an arrow 507. On the basis of the polarization state information, the controller 730 of the exposure apparatus 503 performs control of the polarization controlling means 777 or control of the wafer stage or reticle stage. This is for the reason, for example, that the loss of light quantity by the polarization controlling means differs with the polarization state, and it is carried out to adjust the exposure amount at a desired value.

Although in FIG. 5 the light dividing means and the polarization stage detecting system are disposed outside the exposure apparatus, physically, they may be accommodated within the exposure apparatus. Specifically, the light dividing means may be disposed in a portion of the light path of the illumination optical system 710, to extract a portion of the exposure light, while the extracted exposure light may be measured by the polarization state detecting system. Also, the polarization state detecting system may detect Stokes parameters described with reference to the first embodiment. Alternatively, if it is sufficient to obtain information about p-polarized light (or s-polarized light), and total light quantity only, a structure having a polarizer 104, photodetectors 105 and 106 and an operation unit 112 in FIG. 1 as constituent elements, may be used.

[Embodiment 7]

A seventh embodiment of the present invention concerns an exposure apparatus similar to the sixth embodiment, wherein a light source is controlled on the basis of the polarization state measured by use of a polarization state detecting system, so that the light source emits light in a polarization state suited for the exposure. The control of the light source is carried out in response to a signal produced by a controller 730 inside the exposure apparatus.

[Embodiment 8]

Figure 8:
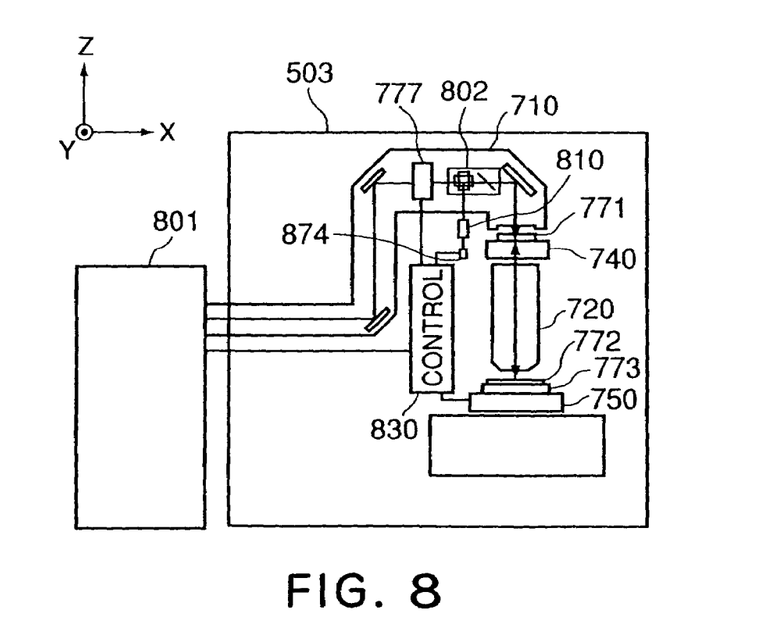
FIG. 8 is a schematic view of an exposure apparatus according to an eighth embodiment of the present invention.

An eighth embodiment of the present invention concerns an exposure apparatus having a light source and an illumination optical system, wherein illumination light produced by an illumination system is divided by light beam dividing means, such as shown in FIG. 2 of the first embodiment, without changing the polarization state, and wherein one of the light beams is used for measurement of the polarization state through the polarization state detecting system as having been described with reference to the first embodiment. This embodiment will be described with reference to FIG. 8. In FIG. 8, similar components as those of the exposure apparatus of FIG. 7 are denoted by corresponding reference numerals. What differs from the exposure apparatus of FIG. 7 is in the point of a light source 801, light dividing means 802, and a detector 874 for receiving light from the light dividing means through a polarizer 810. As regards the light source, an excimer laser such as, for example, a KrF excimer laser (wavelength 248 nm), an ArF excimer laser (wavelength 193 nm), or an $F_2$ excimer laser (wavelength 157 nm), can be used.

The controller 830 of the exposure apparatus operates to feed back the information of polarization state, having been obtained through calculation based on an output of the detector 874, to the illumination system, so as to continuously maintain the illumination system in a best state suited to the exposure. Concurrently, it operates to control the reticle stage and the wafer stage, as well as various components for adjusting the exposure condition, such as the shutter of a stop (not shown).

In the first to eighth embodiments described above, the information regarding the polarization state may be Stokes parameters, any one of the Stokes parameters, or some information related to polarization and obtainable by calculation using Stokes parameters. In accordance with it, regarding the constituent components of the polarization state detecting system, those components corresponding to only a desired portion of the Stokes parameters may be used.

In accordance with the present invention, any change in the polarization state of each pulse of a pulse light source or the polarization state, which is quickly changeable, can be measured. Further, in accordance with the present invention, the polarization state of light in an apparatus having a light source can be measured. Moreover, on the basis of the polarization state of the light, the apparatus can be controlled. Also, in accordance with the present invention, the polarization state of a light source in an exposure apparatus can be detected and, on the basis of the information obtained, exposure parameters, or the like, can be corrected. Alternatively, in accordance with the present invention, the polarization state of a light source can be detected, and the information thus obtained can be fed back to the light source, to correct light emission parameters.

[Embodiment 9]

Next, an embodiment of a device manufacturing method which uses an exposure apparatus, such as described above, will be explained.

Figure 9:
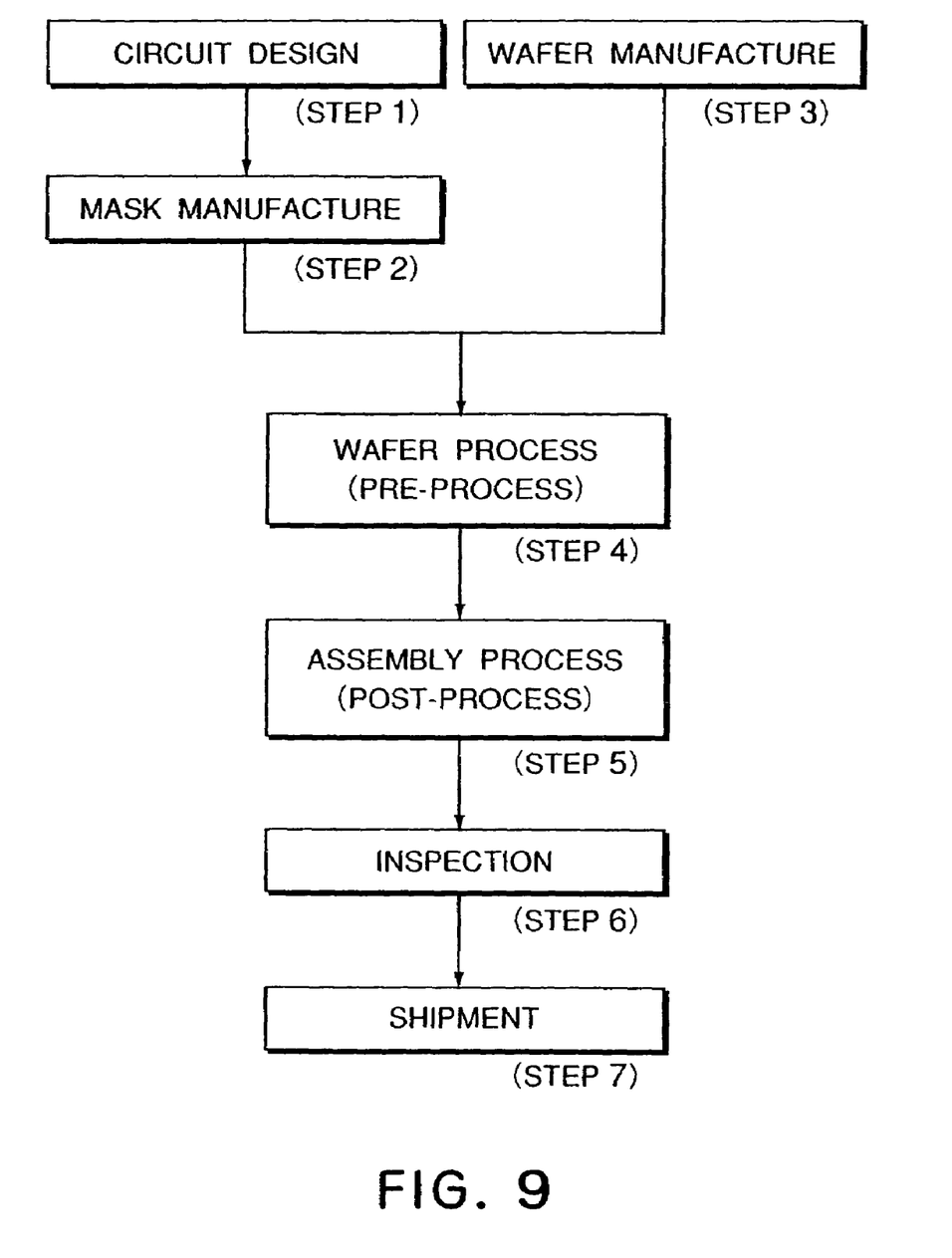
FIG. 9 is a flow chart of device manufacturing processes.

FIG. 9 is a flow chart for explaining the procedure of manufacturing various microdevices such as semiconductor devices (e.g., semiconductor chips such as ICs or LSIs), liquid crystal panels, or CCDs, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process, which is called a pre-process, wherein, by using the thus prepared mask and wafer, a circuit is formed on the wafer, in practice, in accordance with lithography. Step 5 subsequent to this is an assembling step, which is called a post-process, wherein the wafer having been processed at step 4 is formed into semiconductor chips. This step includes an assembling (dicing and bonding) process and a packaging (chip sealing) process. Step 6 is an inspection step wherein an operation check, a durability check, and so on, for the semiconductor devices produced by step 5, are carried out. With these processes, semiconductor devices are produced, and they are shipped (step 7).

Figure 10:
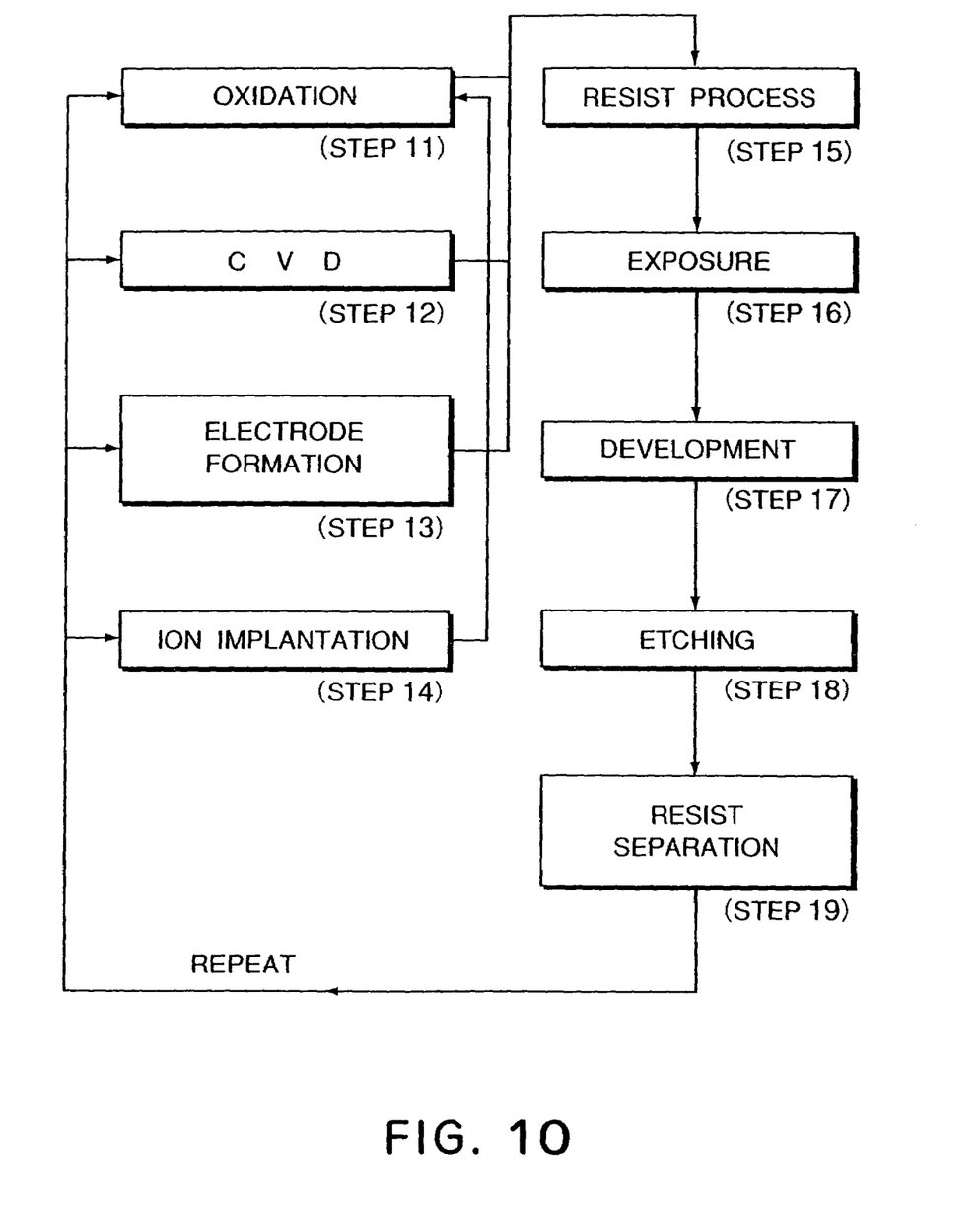
FIG. 10 is a flow chart for explaining details of a wafer process, included in the procedure of FIG. 9.

FIG. 10 is a flow chart for explaining details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

While the invention has been described with reference to the structures disclosed herein, it is not confined to the details set forth and this application is intended to cover such modifications or changes as may come within the purposes of the improvements or the scope of the following claims.

What is claimed is:

1. A polarization state detecting system comprising:

first dividing means for dividing incident light into two light beams having the same polarization state as the incident light, wherein said first dividing means includes a first element, a second element and a third element, said second element is disposed so that a p-polarization component reflected by said first element is reflected by said second element as an s-polarization component, said third element is disposed so that a p-polarization component transmitted through said first element is transmitted by said third element as an s-polarization component, and one of the two light beams is light reflected by said first element and reflected by said second element, while the other of the two light beams is light transmitted through said first element and transmitted through said third element;

a detector for detecting one of the two light beams from said first dividing means, through a polarizer, said polarizer is adapted to divide the one light beam into two orthogonal polarized light beams, and wherein said detector includes two detecting elements for detecting the two polarized light beams, respectively;

acquisition means for acquiring information regarding the polarization state of the incident light on the basis of an output of said detector; and second dividing means for dividing the other light beam from said first dividing means, into two light beams having the same polarization state as the other light beam, a second detector for detecting one of the two light beams from said second dividing means, through a polarizer, and a third detector for detecting the other of the two light beams from said second dividing means, through a phase plate and a polarizer.

2. A polarization state detecting system according to claim 1, wherein the other of the two light beams from said first dividing means is introduced into a predetermined apparatus in which the incident light is to be used.

3. A polarization state detecting system according to claim 2, wherein the information regarding the polarization state is supplied to the predetermined apparatus.

4. A polarization state detecting system according to claim 1, wherein the information regarding the polarization state includes a Stokes parameter.

5. A polarization state detecting system according to claim 1, wherein the incident light is pulse light.

* * * * *

UNITED STATES PATENT AND TRADEMARK OFFICE
CERTIFICATE OF CORRECTION

| | |
|---|---|
| PATENT NO. | : 7,180,051 B2 |
| APPLICATION NO. | : 11/256931 |
| DATED | : February 20, 2007 |
| INVENTOR(S) | : Takeuchi et al. |

Page 1 of 1

It is certified that error appears in the above-identified patent and that said Letters Patent is hereby corrected as shown below:

On the cover page,

[*] Notice: Subject to any disclaimer, the term of this patent is extended or adjusted under 35 USC 154(b) by (38) days

Delete the phrase "by 38" and insert -- by 0 days --

COLUMN 4:

Line 43, "going to" should read -- it will --.
Line 44, "parallel-plane" should read -- parallel-plate --.
Line 45, "going to" should read -- it will --.

Signed and Sealed this

Second Day of December, 2008

JON W. DUDAS
*Director of the United States Patent and Trademark Office*